Nov. 12, 1968 R. A. KNAUB ET AL 3,410,952

ELECTRICAL BUS STRIP

Filed Nov. 4, 1964

INVENTORS
GERALD G. KOSS
RICHARD A. KNAUB
BY Roger A. Marrs
AGENT

United States Patent Office 3,410,952
Patented Nov. 12, 1968

3,410,952
ELECTRICAL BUS STRIP
Richard A. Knaub, Canoga Park, Los Angeles, and Gerald G. Koss, Simi, Calif., assignors to The Bunker-Ramo Corporation, Stamford, Conn., a corporation of Delaware
Filed Nov. 4, 1964, Ser. No. 408,888
10 Claims. (Cl. 174—88)

This invention relates to electrical bus strips and more particularly to an electrical bus line which interconnects a plurality of component terminals or pins employed in the assembly of electrical circuit boards.

In the manufacturing and assembling of electronic circuit boards, it has been the conventional practice to employ a base or foundation of electrically insulating material through apertures in which electrically conductive terminals are held and electronic components and circuitry or assemblies are mounted. A conventional form of terminal comprises a member generally stamped from sheet metal and consisting of an elongated pin portion provided at one end and with a U-shaped lug at the other end. The circuit boards generally provide for the pin side of the terminals to project from one side of the circuit board so that various wiring and external circuit conductors may be wire wrapped to the pin side of the terminal. It is also customary to project the opposite end or lug end of the terminal from the other side of the circuit board for accommodating the connection of various circuit components.

In some electrical circuits, it is required that many terminals be connected to one another by a common strip or line for purposes of grounding, thermal conductivity, common power supply, etc. Such strips are known as bus strips or bars. One conventional bus strip currently in use is simply an uninsulated wire which has been cut to desired length and held against the terminals temporarily until permanent solder connections to the terminals can be made. Using a wire for bus strip purposes is time consuming in production assembling operations since some means are required for temporarily retaining the wire in place. Also, the wires often fall from their positions on the circuit board and must be re-installed.

Another conventional bus strip, which overcomes the inherent temporary retaining problem, comprises a plurality of folded over metal leaf clamps which are connected together by a common strip. It is attached to the circuit board by clamping each leaf of the plurality to a separate pin on the wiring side of the circuit board. Each metal clamp is provided with a small aperture to receive the pin portion of the terminal and the folded metal portion of the clam is sufficiently resilient to grip the pin potrion of the terminal as the strip is installed.

Difficulties have been encountered when employing conventional bus line or strip devices in the past which are due to the fact that the installation of the strip was required on the pin portion of the terminal on the wiring side of the circuit board. Such installation greatly inhibits the connection of circuit lead wires to the pin portion of the terminal since the length of the pin is largely used to accommodate the installation of the bus strip thus leaving only a small length of the pin available for lead wire connection. This problem is acute when employing wire wrap techniques for lead wire connection to the pins, and particularly acute when multiple wire wrap connections must be made on the same length of terminal pin. Furthermore, the installation of the clamp type bus line or strip necessitates the manual forcing or urging of the strip over the sharp pointed terminal pins which may cause injury to the fingers of an assembler installing the clamping bus strip.

Therefore, it is a primary object of the present invention to provide a novel bus strip or line device which is adapted to be readily installed on the component side of a circuit board.

It is another object of the present invention to provide a novel bus line or strip device which offers increased current carrying capacity as well as increased thermal conductivity and reliability.

Still further object of the present invention is to provide a novel bus line or strip device which may be readily installed by an assembler without causing discomfort or injury to the fingers and hands of the assembler during the installation procedure.

Still a further object of the present invention is to provide a novel bus line or strip device which can be readily mounted on the component connection portion of a plurality of terminals and retained thereon to provide adequate mechanical connection and which is further adapted upon the application of heat to provide a proper electrical connection to the terminal.

The bus line or strap device of the present invention includes a bus strip which is adapted to be installed on the component side of a circuit board. It is readily secured to the U-shaped component attachment portion of a terminal by manually bending the strip over the terminal lugs into clamping engagement with the terminal. The bus strip is provided with a plurality of elongated apertures through which the lugs of adjacent terminals may be received so that the length of the strip may seat snugly and firmly in contact with both sides of the component attachment side of the terminal when the bus strip has been properly installed.

The bus strip of the present invention includes a strip of electrically conductive material having a body portion disposed on one side of the terminal and an edge portion disposed on the other side of the terminal. A plurality of connecting strips are employed which connect the body and edge portions in a fixed parallel relationship. These strips are folded or bent over each terminal and urged into gripping relationship with the terminal.

In addition to providing a common connection between desired terminals on the circuit board, the bus line device of the present invention permits the connection of components directly to the strip by soldering and offers increased current carrying capacity as well as increased thermal conductivity. Reliability is greatly increased over bus line strips employed in the past since the application of heat to the bus strip for the soldering of components also electrically secures the strip to the terminals. Consequently, the device of the present invention provides a complete mechanical and electrical connection which meets the specification requirements used in industry.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
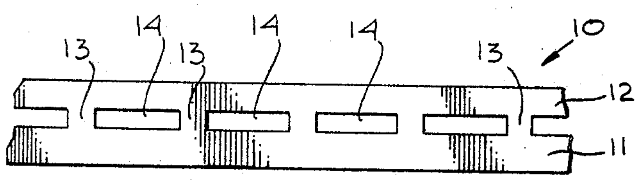
FIGURE 1 is a top plan view of a bus strip or line constructed in accordance with the present invention.

FIG. 1 illustrates a bus line or strip device 10 constructed in accordance with the present invention, which comprises a thin sheet of metal, preferably soft copper, which is hot tin dipped to provide a thin coating of tin approximately .0005 to .002 inch thick. The strip includes a body portion 11 and an edge portion 12 which is of lesser width than the body portion. Connecting the body portion with the edge portion are a plurality of connecting strips 13, so that the body portion, edge portion, and connecting strips define a plurality of elongated openings or apertures 14 extending in an in-line relationship along the entire strip 10. The apertures may be readily formed in the strip by stamping or other convenient procedure. The strip may be made as long as practical and preferably in roll form so that the strips may be measured and severed from the roll to provide a desired length. In this manner, different lengths of bus strip may be cut to length as desired and relatively low scrappage is encountered.

Figure 2:
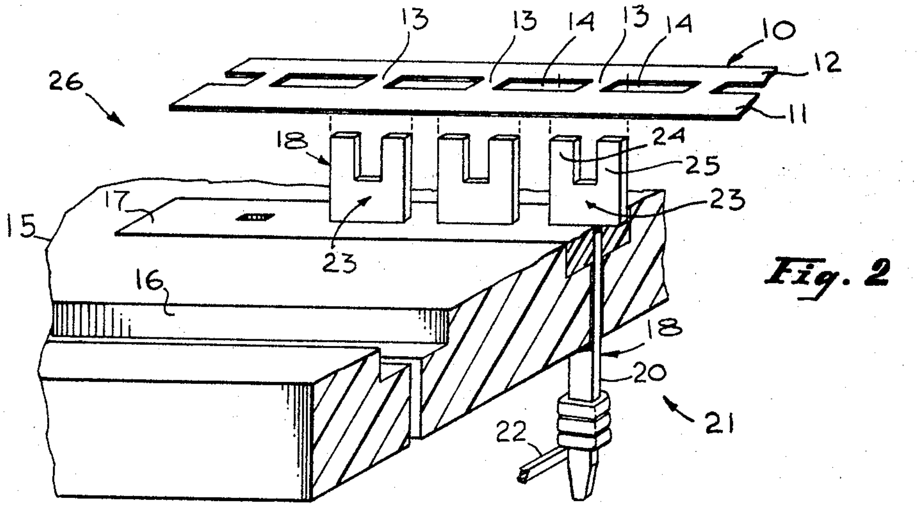
FIG. 2 is a fragmentary perspective view, partially in section, of a conventional circuit board carrying a multiplicity of terminals to which the novel bus strip of FIG. 1 is shown being installed.

FIG. 2 illustrates a conventional circuit board 15 having formed therein several receptacles 16, each for receiving a terminal board or strip 17. The terminal strip may be installed and secured to the circuit board by any suitable means. Each terminal strip is shown provided with a multiplicity of terminals 18, each terminal having an elongated pin portion 20 which extends through the terminal strip 17 and the circuit board to project from a connector or wiring side 21 of the circuit board. The pin portion of the terminal is employed for receiving electrical leads 22 from circuitry which is connected thereto by conventional wire wrap techniques.

The end of the terminal 18 opposite to its pin portion 20 is provided with a U-shaped lug 23 which seats on the terminal board and which includes a pair of upright legs 24 and 25. The terminal lugs are exposed on a component side 26 of the circuit board and are employed for the connection of components used in electrical circuits.

Also, FIG. 2 illustrates the posiiton of the bus strip 10 of the present invention positioned prior to installation on the terminal board. It is to be noted that the bus strip is installed on the component side 26 of the terminal board and that it is disposed so that each connecting strip 13 of the bus line will be received into the space or area of the terminal lug between the legs thereof. Therefore, it may be said that the bus strip is mounted on the terminals by means of each connecting strip 13 resting between a pair of lug legs 24 and 25 so that the bus strip straddles the plurality of terminals with the body portion 11 continuous on one side and the edge portion 12 continuously disposed on the opposite terminal side.

Figure 3:
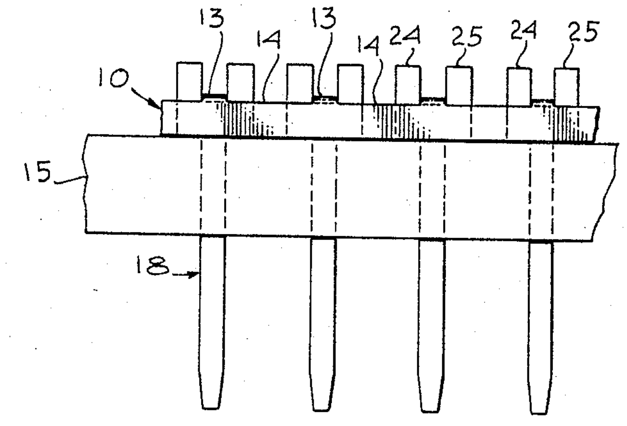
FIG. 3 is a side elevational view of a conventional terminal board incorporating a multiplicty of terminals to which the novel bus line or strip device shown in FIG. 1 is installed.
Figure 4:
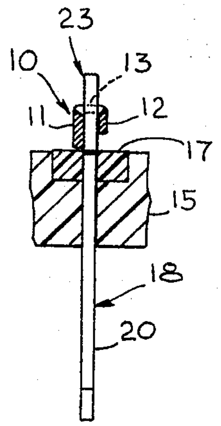
FIG. 4 is an end view of the terminal board of FIG. 3 showing the bus line or strip installed to provide proper mechanical and electrical connection with the multiplicity of terminals.

The bus line or strip is shown in FIGS. 3 and 4 installed on the plurality of terminals by bending the pliable connecting strips 13 along the center line of the bus strip 10 about the terminal lugs so that the bus strip is retained on the terminal board via the lug portions of the terminals. The connecting strips 13 are pliable and can be easily deformed beyond their elastic limits by application of finger pressure. It is noted that each connecting strip is disposed between the lugs of a single terminal so that each opening or aperture 14 embraces adjacent legs associated with two terminal lugs mounted next to each other. By such construction, adequate mechanical connection is achieved between the mating surfaces of the strip body portion, connecting strip and edge portion with the opposite sides of the terminal to retain the bus strip on the terminals.

Inasmuch as the bus strip is composed of relatively soft and pliable metal, finger pressure is all that is required to mechanically secure the bus strip to the plurality of terminals. In a preferred form of the present invention, the body portion of the strip is made substantially wider than the edge portion so that more surface area is provided for the securing of components thereto and so that the strip does not tend to unevenly distort itself longitudinally and laterally upon being laid down and crimped over the terminals. However, it is to be understood that the edge portion may also be made wider in the event additional surface area is required so long as the width is less than the body portion width. Inasmuch as the bus strip is provided with a thin coating of tin, securing the leads of components to the strip by soldering techniques assures adequate electrical connection.

In actual use, the bus strip 10 of the present invention is positioned over a plurality of terminals 23 arranged in a line on a terminal strip 17 mounted on a circuit board 15 as shown in FIG. 2. The bus strip is lowered over the component attaching lugs of the terminal on the component side 26 of the circuit board such that each connecting strip 13 of the bus strip is received into the area or space separating adjacent legs such as legs 24 and 25 of each terminal. The connecting strip seats on the terminal and the apertures 14 of the strip receive adjacent legs of terminal lugs so that the entire strip straddles the plurality of terminals. By employing conventional crimping means or by merely employing finger pressure, the bus is bent along its center line so that the body portion 11 lies in contact with one side of the plurality of terminals and the edge portion 12 lies in contact with the opposite side of the terminals. The deformed bus strip is folded beyond its elastic limit and takes a permanent set so that the entire length of bus strip remains fixed in mechanical connection with the plurality of terminals.

The leads from various electrical or electronic components (not shown) may be soldered to either the body portion or the edge portion of the strip to provide a secure mechanical and electrical connection inasmuch as the heat employed in the soldering procedure causes the tin coating to adhere not only to the circuit component leads but to the terminals as well. Consequently, the component leads, bus strip and terminals become an integral circuit junction or connection.

Although certain specific embodiments of the invention have been shown and described, it is obvious that many modifications thereof are possible without departing from the true scope and spirit of the invention.

What is claimed and desired to be secured by Letters Patent is:

1. A bus strip mounted on a plurality of terminals disposed in a straight line arrangement on a circuit board wherein each terminal includes a component attachment portion consisting of a pair of spaced apart legs comprising:

- a pliable strip of uninsulated electrically conductive material;
- said strip having a body portion engaged with one side of the component attachment portion of each terminal and an edge portion engaged with the other side of the component attachment portion of each terminal; and
- a plurality of connecting strips integrally joining said body portion with said portion together in spaced parallel relationship;
- each connecting strip of said plurality being disposed across the component attachment portion between the pair of legs of each terminal.

2. The invention as defined in claim 1 wherein a coating of heat sensitive electrically conductive material covers said strip.

3. The invention as defined in claim 1 wherein said body portion provides more surface area than said edge portion.

4. A bus strip mounted on a plurality of terminals disposed adjacent each other in a line or row arrangement on a circuit board wherein each terminal includes a component attachment portion consisting of a pair of spaced apart legs comprising:

a pliable strip of uninsulated electrically conductive material;

said strip having a body portion disposed along one side of the component attachment portion of each terminal and an edge portion disposed along the opposite side of the component attachment portion of each terminal; and a plurality of connecting strips integrally connecting said body portion with said edge portion in spaced parallel relationship;

each connecting strip of said plurality being disposed over the component attachment portion between the pair of legs of each terminal and being deformed about the component attachment portion to engage the terminal so that said strip is securely mounted on the plurality of terminals.

5. The invention as defined in claim 4 wherein said body portion, said edge portion and said connecting strips define a plurality of openings and said openings each encompass two legs, one leg belonging to one terminal and the other leg belonging to an adjacent terminal.

6. A bus strip for electrically connecting a plurality of terminals comprising:

a pliable strip of electrically conductive material;

said strip having a body portion, an edge portion and a plurality of connecting strips;

said connecting strips being arranged to integrally join said body portion and said edge portion together in spaced parallel relationship;

said connecting strips being of reduced areas of material as compared to the areas of said body portion and of said edge portion such that said connecting strips are readily deformable by the fingers of the human hand along two axes substantially parallel to the longitudinal axis of said strip when placed over the terminals;

said connecting strips being deformed by bending so that each strip is folded over on itself along said two axes substantially parallel to said longitudinal axis.

7. A deformable bus strip mounted on a plurality of terminals arranged in a row in fixed spaced-apart relationship wherein each terminal includes a component attachment portion having opposite flat planar sides and formed with a pair of spaced-apart legs, comprising:

a pliable strip of uninsulated, electrically conductive material, said strip having a body portion of predetermined width engaged along one side of the component attachment portion of each terminal and an edge portion having a width less than said body portion predetermined width engaged along the opposite side of the component attachment portion of each terminal; and a plurality of connecting strips integrally connecting said body portion with said edge portion arranged in spaced parallel relationship along the length of said pliable strip, each of said connecting strips being disposed over the component attachment portion between the pair of legs of each terminal and being deformed about the component attachment portion to clampingly engage the terminal so that said pliable strip is securely mounted on the plurality of terminals.

8. A bus strip mounted on a plurality of terminals arranged in a row in fixed spaced-apart relationship wherein each terminal includes a component attachment portion having opposite flat planar sides and formed with spaced-apart legs, comprising:

a pair of strips of uninsulated electrically conductive material, one of said strips being engaged along one side of the component attachment portion of each terminal and the other of said strips being of lesser width than the width of said one strip and being engaged along the opposite side of the component attachment portion of each terminal; and a plurality of connecting strips having opposite ends integrally connecting said one strip and said other strip arranged in spaced-apart relationship along the lengths of said strips, each of said connecting strips being substantially bent at its opposite ends so that said one strip and said other strip are in substantially fixed parallel spaced relationship to one another whereby the bus strip constitutes a substantially U-shaped unitary structure, and each of said connecting strips is disposed between adjacent terminal legs.

9. A bus strip useful for electrically connecting a plurality of terminals arranged in a row in fixed spaced-apart relationship to one another wherein each terminal is of substantially the same thickness as the others and each terminal includes a component attachment portion a pair of strip portions of electrically conductive material, one of said portions being wider than the other, and in fixed parallel relationship to one another with one edge surface of each of said strip portions being substantially coplanar with one edge surface of the other strip portion of said pair; and a plurality of connecting strip portions of substantially the same length and in fixed spaced-apart relationship to one another along the lengths of said strip portions, the opposite ends of each of said connecting strip portions integrally connecting the substantially coplanar edges of said strip portions such that said bus strip assumes a U-shaped form with said fixed parallel strip portions being spaced apart by a distance substantially equal to the thickness of the terminals.

10. A bus strip mounted on a plurality of terminals arranged in a row in fixed spaced-apart relationship to each other wherein each terminal includes a component attachment portion having opposite flat planar sides and formed with a pair of spaced-apart legs, comprising:

a pair of strip portions of electrically conductive material, one of said portions being wider than the other, and in fixed parallel relationship to one another with one edge surface of each of said strip portions being substantially coplanar with one edge portion of the other strip portion of said pair; and a plurality of connecting strip portions of substantially the same length and in fixed spaced-apart relationship to one another along the lengths of said strip portions, the opposite ends of each of said connecting strip portions integrally connecting the coplanar edges of said strip portions such that said bus strip constitutes a U-shaped configuration with said respective strip portions contacting respectively opposite sides of the terminals and each of said connecting strip portions being disposed over the component attachment portion between the pair of legs of each terminal.

References Cited

UNITED STATES PATENTS

| | | | |
|---|---|---|---|
| 2,929,964 | 3/1960 | Rhys-Jones | 174—68 |
| 3,193,611 | 7/1965 | Huetten et al. | 174—68 X |
| 1,515,216 | 11/1924 | Kissinger | 248—60 |

FOREIGN PATENTS

| | | |
|---|---|---|
| 255,512 | 7/1926 | Great Britain. |

DARRELL L. CLAY, *Primary Examiner.*